(12) United States Patent
Splithof et al.

(10) Patent No.: US 8,514,012 B2
(45) Date of Patent: Aug. 20, 2013

(54) PULSE SHAPER CIRCUIT WITH REDUCED ELECTROMAGNETIC EMISSION

(75) Inventors: Mike Hendrikus Splithof, Silvolde (NL); Edwin Schapendonk, Oss (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/469,668

(22) Filed: May 11, 2012

(65) Prior Publication Data
US 2012/0293234 A1   Nov. 22, 2012

Related U.S. Application Data

(60) Provisional application No. 61/486,800, filed on May 17, 2011.

(51) Int. Cl.
*H03B 1/00* (2006.01)

(52) U.S. Cl.
USPC ............ 327/552; 327/558; 708/300; 708/301

(58) Field of Classification Search
None
See application file for complete search history.

(56) References Cited

U.S. PATENT DOCUMENTS

| | | | | |
|---|---|---|---|---|
| 4,218,752 A | * | 8/1980 | Hewes et al. | 708/819 |
| 4,550,415 A | * | 10/1985 | Debus et al. | 375/234 |
| 5,323,157 A | * | 6/1994 | Ledzius et al. | 341/143 |
| 5,717,619 A | * | 2/1998 | Spurbeck et al. | 708/319 |
| 5,734,680 A | * | 3/1998 | Moore et al. | 375/263 |
| 6,868,431 B1 | * | 3/2005 | Finol et al. | 708/300 |
| 7,075,363 B1 | * | 7/2006 | Thon | 327/552 |
| 7,346,638 B2 | * | 3/2008 | Lin et al. | 708/300 |
| 7,620,673 B2 | * | 11/2009 | Noga | 708/300 |
| 8,165,255 B2 | * | 4/2012 | Sobchak et al. | 375/355 |
| 2004/0131128 A1 | * | 7/2004 | Roy et al. | 375/295 |
| 2007/0250555 A1 | * | 10/2007 | Piechocki et al. | 708/300 |
| 2008/0263285 A1 | * | 10/2008 | Sharma et al. | 711/147 |

OTHER PUBLICATIONS

D. Su and B. Wooley, "A CMOS Oversampling D/A Converter with a Current-Mode Semidigital Reconstruction Filter", IEEE J. Solid-State Circuits, vol. 28, pp. 1224-1233, Dec. 1993.

* cited by examiner

*Primary Examiner* — Tuan T Lam

(57) ABSTRACT

In one embodiment, a circuit-based apparatus that operates on an input data stream includes delay-line circuitry that characterizes the input data stream, modified over time. A plurality of integrators provide a plurality of integrated signals in response to the delay-line circuitry, and a plurality of weighting amplifiers amplify the plurality of integrated signals by a plurality of respective time-varying weighting factors to provide weighted signals. A signal-combining circuit combines the weighted signals. The circuit-based apparatus also includes a plurality of parallel signal-processing circuit paths that couple the weighted signals to the signal-combining circuit. By combining the weighted signals from the parallel signal-processing circuit paths, the signal-combining circuit provides a signal representative of the input data stream.

24 Claims, 4 Drawing Sheets

PULSE SHAPER CIRCUIT WITH REDUCED ELECTROMAGNETIC EMISSION

This patent document claims benefit under 35 U.S.C. §119 to U.S. Provisional Patent Application Ser. No. 61/486,800, entitled "Pulse Shaper Circuit with Reduced Electromagnetic Emission" and filed on May 17, 2011, which is fully incorporated herein by reference.

Pulse shaped circuits, that operate on an input data stream, can include a filter having a shift register, such as a delay line with a large number of stages, an equal amount of filter coefficients, and a summing node. The input data stream, a time-discrete input signal, is provided to an input of the shift register, and traverses through the shift register at each clock cycle. Each intermediate node of the shift register is connected to a filter coefficient denoted, and therein, an impulse response of the filter is realized. In this manner, the input signal is convolved with the impulse response of the filter. At the summing node, a filtered version of the input signal is obtained.

The filter coefficients are time invariant, which results in a rather edgy step response. This implies the presence of many higher harmonics, which is undesirable. A smoother step-response can be achieved by increasing the amount of filter coefficients, which also increases chip size.

These and other matters have presented challenges to operating on an input data stream for a variety of applications.

Various example embodiments are directed to circuit-based apparatuses for operating on an input data stream and methods of use.

According to one example embodiment, aspects of the instant disclosure are directed towards a circuit-based apparatus for operating on an input data stream. The circuit-based apparatus includes at least one delay-line circuit that characterizes the input data stream that is modified over time. The circuit-based apparatus also includes a plurality of integrators which provide a plurality of integrated signals in response to the at least one delay-line circuit. Further, a plurality of weighting amplifiers are included in the apparatus to amplify the plurality of integrated signals by a plurality of respective time-varying weighting factors, which thereby provides weighted signals. Additionally, in response to the plurality of weighting amplifiers, a signal-combining circuit combines the weighted signals. The circuit-based apparatus also include a plurality of parallel signal-processing circuit paths. Each of these paths couples the weighted signals (weighted by one of the respective time-varying weighting factors) to the signal-combining circuit. By combining the weighted signals from the parallel signal-processing circuit paths, the signal-combining circuit provides a signal representative of the input data stream.

The instant disclosure is additionally directed towards circuit-based apparatuses, for operating on an input data stream, having a set of N parallel signal-processing circuit paths. Each of these paths includes a first-order integrator, a delay-line circuit and a weighting amplifier. The first-order integrator, delay-line circuit and weighting amplifier are arranged in parallel and provide a time-continuous signal representing at least N (a number of time-based coefficient weightings) samples of the input data stream. In the respective parallel signal-processing circuit paths, the input data stream is modified over time and amplitude by the delay-line circuit and the weighting amplifier. The time-continuous signals provided by the respective parallel signal-processing circuit paths are combined by a signal-combining circuit.

Certain aspects of the instant disclosure are directed towards circuit-based apparatuses for operating on an input data stream. These circuit-based apparatuses include a set of N (a number of time-based coefficient weightings) parallel signal-processing circuit paths, each of which has delay-line circuitry, first-order integrators, and weighting amplifiers. The delay-line circuitry modifies segments of the input data stream, over time, into a series of time-discrete data signals. The first-order integrators receive the time-discrete data signals from the delay-line circuitry and convert the time-discrete data signals into time-continuous signals, which represent at least N samples of the input data stream. The weighting amplifiers weight the time-continuous signals of the input data stream. Each of the time-continuous signals, provided by the respective parallel signal-processing circuit paths, are combined by a signal-combining circuit. In response thereto, an amplifier provides an output signal that represents the input data stream.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
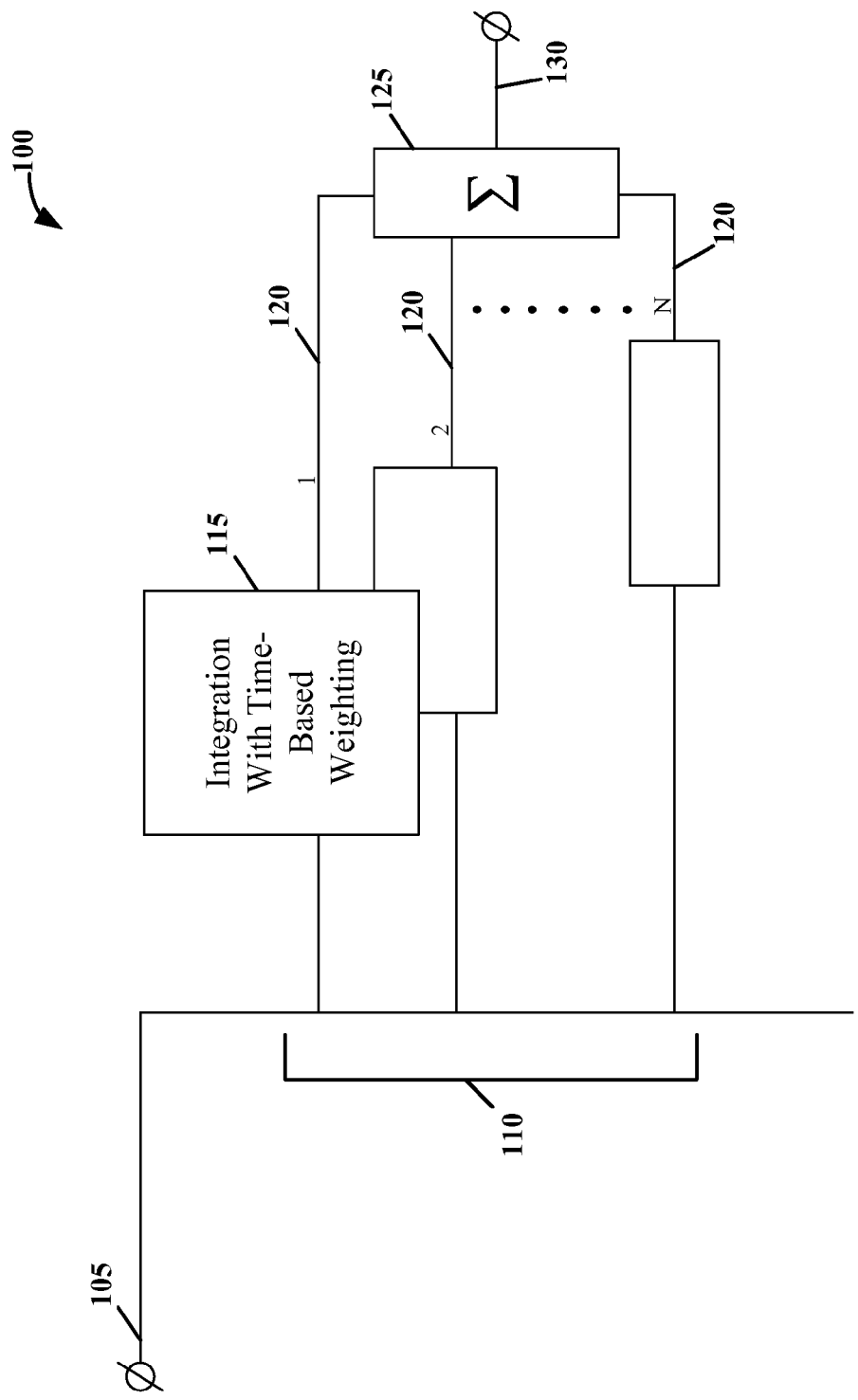
FIG. 1 shows an example block diagram of circuit-based apparatuses for operating on an input data stream, consistent with aspects of the instant disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims. In addition, the term "example" as used throughout this application is only by way of illustration, and not limitation.

Aspects of the present invention are believed to be applicable to a variety of different types of devices, systems and arrangements involving circuit-based apparatuses for operating on an input data stream. While the present invention is not necessarily so limited, various aspects of the invention may be appreciated through a discussion of examples using this context.

Utilization of time-varying coefficients implemented by a non-linear circuit allows for efficient input data shaping. A weighted sum of a limited amount of time-shifted versions of shaped pulses will be generated. As such, the filter function can be combined with time-varying coefficients, and higher harmonics will be sufficiently suppressed. Thus, an output signal, generated in accordance with aspects of the instant disclosure, can have characteristics that are typical for a filter (e.g., finite impulse response filter) with time-varying coefficients. In this manner, the output is time continuous. In this regard, a similar pulse shape can be generated digitally. Additionally, by using a digital-to-analog converter (DAC), an analog version can be derived. This analog version will still be time discrete, therefore images of the baseband signal will appear around multiples of the used clock frequency. These images can be observed by measuring the signal with a spectrum analyzer. Additionally, the output signal, produced by aspects of the instant disclosure, repeats around multiples of the used clock frequency. This results in notches in the frequency domain.

Various example embodiments are directed to circuit-based apparatuses for operating on an input data stream. These circuit-based apparatus includes at least one delay-line circuit (e.g., as controlled by a 30 KHz, few-to-several microseconds microseconds clock) that characterizes the input data stream as modified over time. In response to the at least one delay-line circuit, a plurality of integrators provides a plurality of integrated signals. A plurality of weighting amplifiers amplifies the plurality of integrated signals by a plurality of respective time-varying weighting factors, which thereby provides weighted signals. A signal-combining circuit combines the weighted signals in response to the plurality of weighting amplifiers. Additionally, a plurality of parallel signal-processing circuit paths, included in the circuit-based apparatuses, couples the weighted signals (weighted by one of the respective time-varying weighting factors) to the signal-combining circuit. By combining the weighted signals from the parallel signal-processing circuit paths, the signal-combining circuit provides a signal representative of the input data stream.

In certain embodiments, the plurality of integrators in the circuit-based apparatus are first-order integrators. In other embodiments, the first other integrators execute a time-varying transfer function, using a first-order integration, that generates a trapezoid function. Further, some embodiments of the weighting amplifiers provide the weighted signals as time-continuous signals. Additionally, each weighting amplifier can provide the weighted signals by gradually changing amplification of a respective one of the plurality of integrated signals over time. Further, in certain embodiments, the weighted signals are time-varying current signals.

Various aspects of the instant disclosure are additionally directed towards circuit-based apparatuses, for operating on an input data stream, having a set of N parallel signal-processing circuit paths. The parallel signal-processing circuit paths include a first-order integrator (e.g., a first-order finite-impulse-response filter), a delay-line circuit and a weighting amplifier. The first-order integrator, delay-line circuit and weighting amplifier are arranged in parallel to provide a time-continuous signal (e.g., a time-varying current signal) representing at least N samples of the input data stream. In each of the paths, the input data stream is modified over time and amplitude by the delay-line circuit and the weighting amplifier. In some embodiments, the first-order integrator, delay-line circuit and weighting amplifier provide a nonlinear time-varying operation, in each parallel signal-processing circuit path, to provide the time-continuous signal. The time-continuous signals provided by the respective parallel signal-processing circuit paths are combined by a signal-combining circuit. In certain embodiments, combined signals provided by the signal-combining circuit represent the input data stream. Additionally, an amplifier can be included in a circuit-based apparatus, consistent with the instant disclosure, which is responsive to the signal-combining circuit, and provides an output signal that represents the input data stream.

Certain embodiments of the first-order integrators, which are finite-impulse-response filters, provide a time-continuous signal to the weighting amplifier. Additionally, in other embodiments of the circuit-based apparatuses where the first-order integrator is a finite-impulse-response filter, the integrators in the parallel processing paths execute a time-varying transfer function. Further, some embodiments of the circuit-based apparatuses include first-order integrators as finite-impulse-response filters, and in those instances, the delay-line circuits provide a time-discrete signal to the first-order finite-impulse-response filters (in the parallel paths), which in turn execute a time-varying transfer function. Further, the first-order integrators in the paths can also be arranged to suppress high-frequency harmonics.

Some embodiments of the weighting amplifiers, in each of the parallel signal-processing paths, provide fixed-gain amplification. Further, the weighting amplifiers will provide different gains in each of the paths. In certain embodiments, the signal-combining circuit additionally provides a combined signal that represents the input data stream. In those instances, each of the weighting amplifiers, in the parallel paths, provide different gains and facilitate suppression of high-frequency harmonics in the combined signal.

Aspects of the instant disclosure are directed towards circuit-based apparatuses for operating on an input data stream which have a set of N (a number of time-based coefficient weightings) parallel signal-processing circuit paths. Each path includes delay-line circuitry, a first-order integrator, and a weighting amplifier. The delay-line circuitry modifies, over time, segments of the input data stream into a series of time-discrete data signals. From the delay-line circuitry, the first-order integrators receive the time-discrete data signals, and convert the time-discrete data signals into time-continuous signals, which represent at least N samples of the input data stream. In response thereto, the weighting amplifiers weight the time-continuous signals of the input data stream. Each of the time-continuous signals, provided by the respective parallel signal-processing circuit paths, are combined by a signal-combining circuit. An amplifier provides an output signal that represents the input data stream from the signals combined by the signal-combining circuit.

In certain embodiments, the first-order integrators additionally execute a time-varying transfer function, with a MOS-based current mirror, using first-order integration to generate a trapezoid function. Further, the first-order integrators can also execute a time-varying transfer function, which includes a cascade of a first-order integration and a differential pair. In those instances, the output signal is time-continuous. The output signal, in some embodiments, behaves non-causally, and the signal-processing signal paths each include one delay-line circuit, which is configured and arranged with a zero-delay stage.

Turning now to the figures, FIG. 1 shows an example embodiment of a circuit-based apparatus 100 for operating on an input data stream 105. The circuit-based apparatus 100 includes at least one delay-line circuit that characterizes the input data stream 105 as modified over time. In response to the at least one delay-line circuit, a plurality of integrators provides a plurality of integrated signals. A plurality of weighting amplifiers amplifies the plurality of integrated signals by a plurality of respective time-varying weighting factors, which thereby provides weighted signals 120. A signal-combining circuit 125 combines the weighted signals 120 in response to the plurality of weighting amplifiers. Additionally, a plurality of parallel signal-processing circuit paths 110, included in the circuit-based apparatus 100, couples the weighted signals 120 (weighted by one of the respective time-varying weighting factors) to the signal-combining circuit 125. By combining the weighted signals from the parallel signal-processing circuit paths, the signal-combining circuit provides a signal 130 representative of the input data stream. As shown in FIG. 1, the at least one delay-line circuit, integrators, and weighting amplifiers are included in one processing block 115. In certain embodiments, the plurality of integrators contained in each of the processing blocks 115 are first-order integrators. In other embodiments, the first other integrators execute a time-varying transfer function, using a first-order integration, that generates a trapezoid function.

Further, some embodiments of the weighting amplifiers provide the weighted signals (e.g., time-varying current signals) as time-continuous signals. Additionally, each weighting amplifier can provide the weighted signals by gradually changing amplification of a respective one of the plurality of integrated signals over time.

Additionally, using FIG. 1 as a reference, another example embodiment of circuit-based apparatuses for operating on an input data stream is presented. A circuit-based apparatus 100, as shown with reference to FIG. 1, operates on an input data stream 105. The circuit-based apparatus 100 includes a set of N parallel signal-processing circuit paths 110. The paths 110 each include a first-order integrator (e.g., a first-order finite-impulse-response filter), a delay-line circuit and a weighting amplifier, all of which are shown included in integration with time-based weighting blocks 115. The first-order integrator, delay-line circuit and weighting amplifier (collectively within Integration with Time-based Weighting block 115) are arranged in parallel to provide a time-continuous signal 120 (e.g., a time-varying current signal) representing at least N samples of the input data stream 105. In each of the parallel signal-processing circuit paths 110, the input data stream 105 is modified over time and amplitude by the delay-line circuit and the weighting amplifier.

In some embodiments, the first-order integrator, delay-line circuit and weighting amplifier provide a nonlinear time-varying operation, in each parallel signal-processing circuit path 110, to provide the time-continuous signal 120. The time-continuous signals 120, in each path, provided by the respective parallel signal-processing circuit paths 110 are combined by a signal-combining circuit 125. In certain embodiments, combined signal 130 provided by the signal-combining circuit 125 represents the input data stream 105. In certain of those instances, the weighting amplifiers, in the parallel paths 110, provide different gains and facilitate suppression of high-frequency harmonics in the combined signal. The weighting amplifiers, in the signal-processing paths 110, can provide fixed-gain amplification. Further, the weighting amplifiers, in some embodiments, can provide different gains in each of the paths.

In certain embodiments, the first-order integrators, which are finite-impulse-response filters, provide a time-continuous signal 120 to the weighting amplifier (which occurs in the Integration with Time-based Weighting block 115). Additionally, in some embodiments, the circuit-based apparatus 100, the integrators (finite-impulse-response filters), which are in the parallel processing paths 110, execute a time-varying transfer function. The first-order integrators (e.g., finite-impulse-response filters) in the circuit-based apparatus 100 can include delay-line circuits that provide a time-discrete signal to the first-order finite-impulse-response filters (in the parallel paths 110), which in turn execute a time-varying transfer function. Further, the first-order integrators in the paths 110 can also be arranged to suppress high-frequency harmonics.

Figure 2:
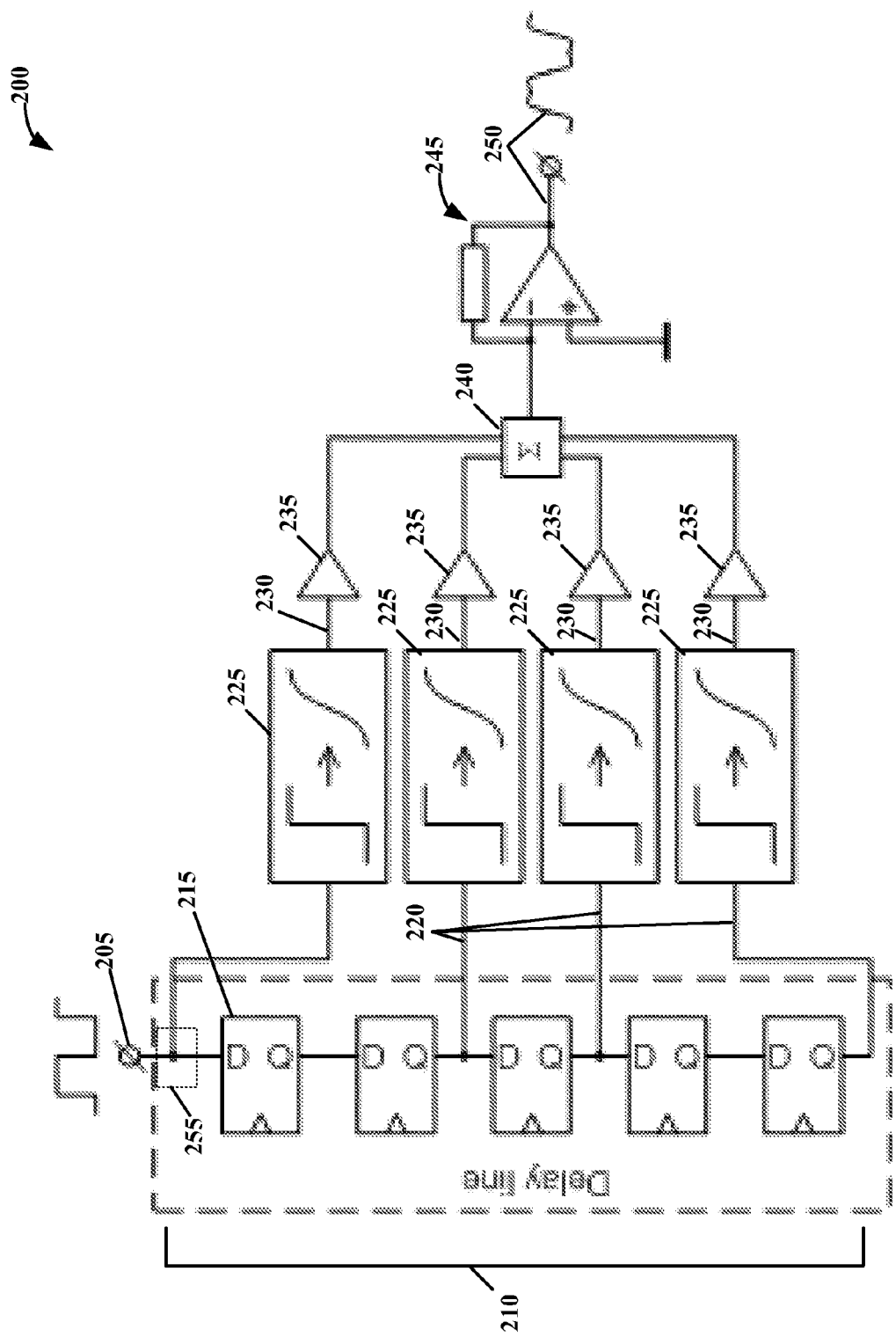
FIG. 2 shows another example diagram of circuit-based apparatuses for operating on an input data stream, consistent with various aspects of the instant disclosure.

FIG. 2 shows another example arrangement of a circuit-based apparatus 200, consistent with embodiments of the instant disclosure. The circuit-based apparatus 200 operates on an input data stream 205 and includes a set of N (a number of time-based coefficient weightings) parallel signal-processing circuit paths 210. Each path 210 includes delay-line circuitry 215, a first-order integrator 225, and a weighting amplifier 235. The delay-line circuitry 215 modifies segments of the input data stream 105 into a series of time-discrete data signals 220, over time. The first-order integrators 225 receive the time-discrete data signals 220 from the delay-line circuitry 215, and convert the time-discrete data signals 220 into time-continuous signals 230, which represent at least N samples of the input data stream 205. The weighting amplifiers 235 weight the time-continuous signals 230 of the input data stream (in response to the first-order integrators 225 converting the time-discrete data signals 220 into time-continuous signals 230). Each of the time-continuous signals 230, provided by the respective parallel signal-processing circuit paths 210, are combined by a signal-combining circuit 240. Subsequently, an amplifier 245 provides an output signal 250 that represents the input data stream 205 from the signals combined by the signal-combining circuit 240. The output signal 250, in some embodiments, behaves non-causally. Further, in those instances, the signal-processing signal paths 210, each of which include a delay-line circuit, having a zero-delay stage 255.

Figure 3:
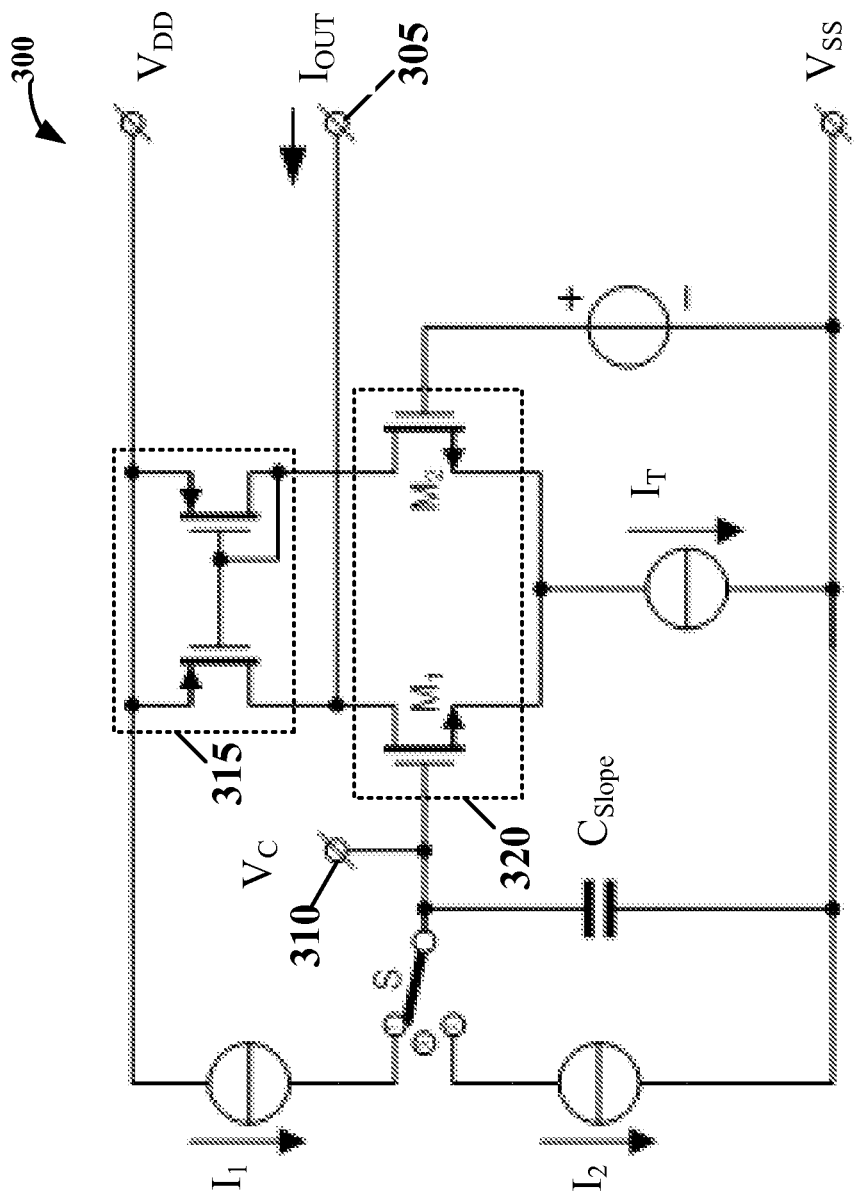
FIG. 3 shows an example of a non-linear time-varying coefficient circuit, consistent with aspects of the instant disclosure.

FIG. 3 shows implementation of a non-linear time-varying coefficient circuit 300, which can be implemented in conjunction with an integrator as described above and the integrators shown in FIGS. 1 and 2, for example. A power based signal 305 (e.g., a current signal) is provided to the non-linear time-varying coefficient circuit 300. The integration provided by the non-linear time-varying coefficient circuit 300 is output at the $V_C$ node 310. The integration is provided through a time-varying transfer function implemented by a cascade of a (first-order) integrator, as shown above in FIG. 1 or FIG. 2 (for example), and a differential pair 315. The integrators additionally execute a time-varying transfer function, with a MOS-based current mirror 320, using first-order integration to generate a trapezoid function as shown in further detail in FIG. 4. Additionally, a cascade of first-order integrators in conjunction with a differential pair 315 can execute a time-varying transfer function, and the output signal produced therefrom is time-continuous.

Figure 4:
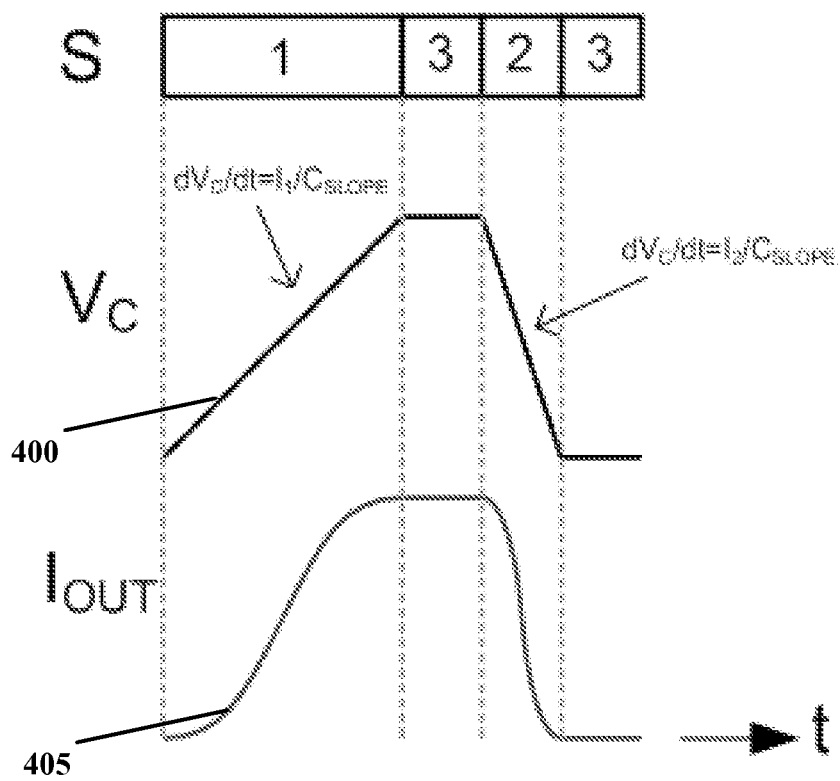
FIG. 4 shows an example transfer function, consistent with various aspects of the instant disclosure, of the non-linear time-varying coefficient circuit shown in FIG. 3.

FIG. 4 shows a trapezoid function 400 being generated, consistent with aspects of the instant disclosure. The trapezoid function 400 is available at the output of one of the integrators of FIG. 2 or FIG. 3 (e.g., at the $V_C$ node). This power-based signal is then converted into a function that approximates a cosine shape 405 (having few harmonics) with the help of a MOS differential pair (e.g., as shown in FIG. 3).

Aspects of the instant disclosure can be used in low-cost digital interfaces, for instance, such as in-vehicle networks, where shielding is utilized to reduce electromagnetic emissions. Examples of such in-vehicle networks include, e.g., controller area networks (CAN), Local Interconnect Network (LIN), FlexRay, Peripheral Sensor Interface 5 (PSI5), and High-Definition Multimedia Interface (HDMI). Additionally, aspects of the instant disclosure could be employed in an angular sensor with digital output (SENT protocol).

The present invention has been described with respect to particular embodiments and with reference to certain drawings, but the invention is not limited thereto. The drawings described are only schematic and are non-limiting. In the drawings, for illustrative purposes, the size of various elements may be exaggerated and not drawn to a particular scale. It is intended that this invention encompasses inconsequential variations in the relevant tolerances and properties of components and modes of operation thereof. Imperfect practice of the invention is intended to be covered.

Where the terms "comprising," "comprises" or the like are used in the present description, they do not exclude other elements or steps. Hence, the terms "comprising," "comprises" and the like should not be interpreted as being restricted to the items listed thereafter; they do not exclude other elements or steps, and so the scope of the expression "a device comprising items A and B" should not be limited to devices consisting only of components A and B. This expression signifies that, with respect to the present invention, the only relevant components of the device are A and B.

Various modules may be implemented to carry out one or more of the operations and activities described herein and/or shown in the figures. In these contexts, a "module" is a circuit that carries out one or more of these or related operations/ activities (e.g., characterizing input data stream modified over time). For example, in certain of the above-discussed embodiments, one or more modules are discrete logic circuits or programmable logic circuits (e.g., digital and/or analog circuitry) configured and arranged for implementing these operations/activities, as in the circuit modules shown in the FIGS. 1-3. In certain embodiments, the programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made without strictly following the exemplary embodiments and applications illustrated and described herein. Furthermore, various features of the different embodiments may be implemented in various combinations. Such modifications do not depart from the true spirit and scope of the present disclosure, including those set forth in the following claims.

What is claimed is:

1. A circuit-based apparatus for operating on an input data stream, comprising:
at least one delay-line circuit configured and arrange to characterize the input data stream modified over time;
a plurality of integrators configured and arranged to respond to the at least one delay-line circuit by providing a plurality of integrated signals;
a plurality of weighting amplifiers configured and arranged to amplify the plurality of integrated signals by a plurality of respective time-varying weighting factors and thereby provide weighted signals;
a signal-combining circuit configured and arranged to respond to the plurality of weighting amplifiers by combining the weighted signals;
a plurality of parallel signal-processing circuit paths, each parallel signal-processing circuit path configured and arranged to couple the weighted signals, as weighted by one of the respective time-varying weighting factors, to the signal-combining circuit, whereby the signal-combining circuit is configured and arranged to provide a signal representative of the input data stream by combining the weighted signals provided by the parallel signal-processing circuit paths.

2. The circuit-based apparatus of claim 1, wherein the plurality of integrators are first-order integrators.

3. The circuit-based apparatus of claim 1, wherein each weighting amplifier is configured and arranged to provide the weighted signals as time-continuous signals.

4. The circuit-based apparatus of claim 1, wherein each weighting amplifier is configured and arranged to provide the weighted signals by gradually changing amplification of a respective one of the plurality of integrated signals over time.

5. The circuit-based apparatus of claim 1, wherein each of the weighted signals is a time-varying current signal.

6. A circuit-based apparatus for operating on an input data stream, comprising:
a set of N parallel signal-processing circuit paths, each parallel signal-processing circuit path in the set including a first-order integrator, a delay-line circuit and a weighting amplifier arranged in parallel and configured to provide a time-continuous signal that represents at least N samples of the input data stream, as modified over time and amplitude by the delay-line circuit and the weighting amplifier in the respective parallel signal-processing circuit path in the set, where N indicates a number of time-based coefficient weightings; and
a signal-combining circuit configured and arranged to combine each of the time-continuous signals provided by the respective parallel signal-processing circuit paths in the set.

7. The circuit-based apparatus of claim 6, wherein the first-order integrator is a first-order finite-impulse-response filter.

8. The circuit-based apparatus of claim 6, wherein the signal-combining circuit is further configured and arranged to provide a combined signal that represents the input data stream.

9. The circuit-based apparatus of claim 6, further including an amplifier, responsive to the signal-combining circuit, for providing an output signal that represents the input data stream.

10. The circuit-based apparatus of claim 6, wherein each of the time-continuous signals is a time-varying current signal.

11. The circuit-based apparatus of claim 6, wherein each first-order integrator is a finite-impulse-response filter configured and arranged to provide a time-continuous signal to the weighting amplifier.

12. The circuit-based apparatus of claim 6, wherein each first-order integrator is a finite-impulse-response filter configured and arranged to execute a time-varying transfer function.

13. The circuit-based apparatus of claim 6, wherein each first-order integrator is a finite-impulse-response filter, and wherein each delay-line circuit is configured and arranged to provide a time-discrete signal to the respective first-order finite-impulse-response filter wherefrom the respective first-order finite-impulse-response filter is configured and arranged to execute a time-varying transfer function.

14. The circuit-based apparatus of claim 6, wherein in each parallel signal-processing circuit path, the first-order integrator, delay-line circuit and weighting amplifier provide a non-linear time-varying operation to provide the time-continuous signal.

15. The circuit-based apparatus of claim 6, wherein in each parallel signal-processing circuit path, the first-order integrator is configured and arranged to suppress high-frequency harmonics.

16. The circuit-based apparatus of claim 6, wherein in each parallel signal-processing circuit path, the weighting amplifier provides fixed-gain amplification, and wherein the weighting amplifiers in the respective parallel signal-processing circuit paths provide different gains.

17. The circuit-based apparatus of claim 6, wherein the signal-combining circuit is further configured and arranged to provide a combined signal that represents the input data stream, and wherein the weighting amplifiers in the respective parallel signal-processing circuit paths are configured and arranged to provide different gains and to facilitate suppression of high-frequency harmonics in the combined signal that represents the input data stream.

18. The circuit-based apparatus of claim 6, wherein the first-order integrator is configured and arranged to execute a time-varying transfer function which uses a first-order integration that generates a trapezoid function.

19. A circuit-based apparatus for operating on an input data stream, comprising:
   a set of N parallel signal-processing circuit paths, each parallel signal-processing circuit path in the set including
      delay-line circuitry configured and arranged to modify segments of the input data stream over time into a series of time-discrete data signals,
      first-order integrators configured and arranged to receive the time-discrete data signals and convert the time-discrete data signals into time-continuous signals that represents at least N samples of the input data stream, and
      weighting amplifiers configured and arranged to weight the time-continuous signals of the input data stream, where N indicates a number of time-based coefficient weightings;
   a signal-combining circuit configured and arranged to combine each of the time-continuous signals provided by the respective parallel signal-processing circuit paths in the set; and
   an amplifier, responsive to the signal-combining circuit, for providing an output signal that represents the input data stream.

20. The circuit-based apparatus of claim 19, wherein the first-order integrators are further configured and arranged, with a MOS-based current mirror, to execute a time-varying transfer function which uses the first-order integration to generate a trapezoid function.

21. The circuit-based apparatus of claim 19, wherein the first-order integrators are further configured and arranged to execute a time-varying transfer function which includes a cascade of a first-order integration and a differential pair, and the output signal is time continuous.

22. The circuit-based apparatus of claim 19, wherein the output signal behaves non-causally, and wherein the set of N parallel signal-processing signal passes includes one said delay-line circuitry further configured and arranged with a zero-delay stage.

23. A method of using a circuit-based apparatus for operating on an input data stream, comprising:
   providing a time-continuous signal that represents at least N samples of the input data stream as modified over time and amplitude by a set of N parallel signal-processing circuit paths, each parallel signal-processing circuit path in the set including a first-order integrator, a delay-line circuit and a weighting amplifier arranged in respective parallel signal-processing circuit paths in the set, where N indicates a number of time-based coefficient weightings; and
   combining each of the time-continuous signals provided by the respective parallel signal-processing circuit paths in the set.

24. The method of claim 23, further including providing an output signal that represents the input data stream.

* * * * *